United States Patent
Levenson

(10) Patent No.: US 6,924,081 B1
(45) Date of Patent: Aug. 2, 2005

(54) PHOTOSENSITIVE MATERIAL FOR IMMERSION PHOTOLITHOGRAPHY

(76) Inventor: Marc David Levenson, 19868 Bonnie Ridge Way, Saratoga, CA (US) 95070

( * ) Notice: Subject to any disclaimer, the term of this patent is extended or adjusted under 35 U.S.C. 154(b) by 18 days.

(21) Appl. No.: 10/775,313

(22) Filed: Feb. 10, 2004

Related U.S. Application Data

(60) Provisional application No. 60/485,988, filed on Jul. 10, 2003.

(51) Int. Cl.[7] ................................................ G03F 7/00
(52) U.S. Cl. ..................................... 430/270.1; 430/311
(58) Field of Search ............................... 430/270.1, 311

(56) References Cited

U.S. PATENT DOCUMENTS 5,173,381 A * 12/1992 Natansohn et al. ........... 430/19

* cited by examiner

Primary Examiner—Amanda Walke
(74) Attorney, Agent, or Firm—Rodney T. Hodgson

(57) ABSTRACT

When rays of light converge inside a photosensitive material at angles larger than 70 degrees, one polarization of the light may fail to produce the desired image contrast in conventional exposure media. This invention describes a material which may be applied to a semiconductor wafer surface which ensures that the photosensitive material is exposed principally by light polarized parallel to the semiconductor wafer surface.

7 Claims, 5 Drawing Sheets

PHOTOSENSITIVE MATERIAL FOR IMMERSION PHOTOLITHOGRAPHY

CROSS REFERENCE TO RELATED APPLICATIONS

This application claims priority pursuant to 35 U.S.C. 119(e) to U.S. Provisional Application No. 60/485,988 filed Jul. 10, 2003 which is incorporated herein by reference in its entirety including incorporated material.

FIELD OF THE INVENTION

The field of the invention is the field of photoresists and contrast agents for immersion photolithographic applications.

RELATED PATENTS AND APPLICATIONS

This application is related to two applications by the same inventor filed on the same day as the present invention entitled "Photosensitive material for immersion photolithography" and "Immersion photolithography apparatus and system".

OBJECTS OF THE INVENTION

It is an object of the invention to produce a method, an apparatus, a system, a contrast enhancing material, and/or a photoresist material for exposing photoresist in a photoresist exposing tool where the photoresist is immersed in a high index transparent fluid for exposing finer features than possible when it is immersed a normal transparent material having index of refraction approximately equal to one.

SUMMARY OF THE INVENTION

A photoresist material and exposure method are disclosed wherein the photoresist material in a layer on the surface of a substrate is exposed only by a component of light polarized parallel with the substrate.

DETAILED DESCRIPTION OF THE INVENTION

Figure 1A:
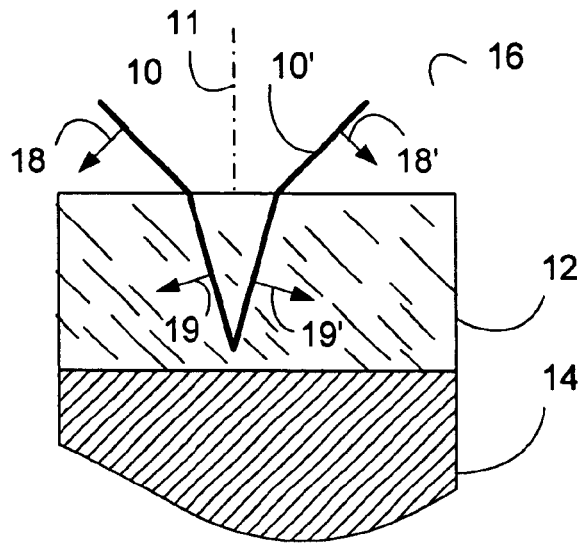
FIG. 1A shows light entering a photoresist, the light having a polarization with a component perpendicular to the surface of the photoresist.
Figure 1B:
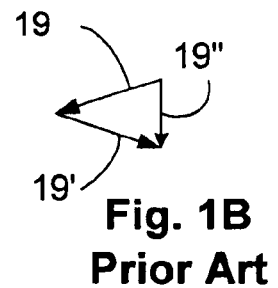
FIG. 1B shows the electric fields of a first set of phases of the light of FIG. 1A.
Figure 1C:
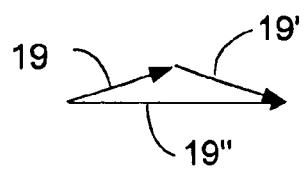
FIG. 1C shows the electric fields of a second set of phases of light of FIG. 1A.
Figure 1D:
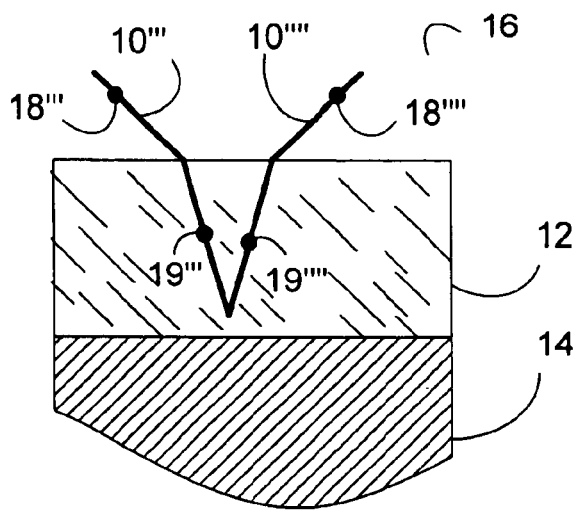
FIG. 1D shows light entering a photoresist, the light having polarization parallel to the surface of the photoresist.
Figure 1E:
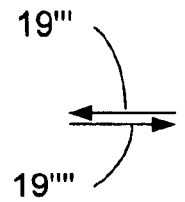
FIG. 1E shows the electric fields of a first set of phases of the light of FIG. 1D.
Figure 1F:
FIG. 1F shows the electric fields of a of a second set of phases of light of FIG. 1D.

Images exposed in a photoresist are formed by light beams from the same point in a mask being imaged together and interfering in the photoresist. If the angle between the beams inside the photosensitive medium is less than 70 degrees, polarization is not a major issue. FIG. 1A shows the usual case of light beams 10 and 10' representing light beams from a high numerical aperture (N.A.) imaging system impinging on a photoresist layer 12 supported by a substrate 14. Normally, the light beams 10 and 10' propagate through a medium 16 with index of refraction n nearly equal to 1. (The medium may be air, an inert gas like nitrogen or argon, or indeed a vacuum). As the light beams 10 and 10' pass through the boundary at an angle with respect to the normal 11 to the surface of the substrate 14 and the photoresist 12, between the medium 16 and the photoresist layer 12, where the photoresist has an index of refraction greater than 1 (in the region of n=1.6) the light beams 10 and 10' bend. If the light beams 10 and 10' are polarized with a component of the electric field perpendicular to the surface of the photoresist (for example if the light beams are polarized in the plane determined by the light beam and the normal to the surface of the photoresist), as shown by the arrows 18 and 18' representing the electric field of the light beams, bending of the light beams 10 and 10' ensures that the electric fields 19 and 19' of the light beams 10 and 10' are much more parallel to the surface of substrate 14 and to each other inside the resist than outside the resist. FIG. 1B shows electric fields 19 and 19' for the case that light beams 10 and 10' are out of phase (as shown in FIG. 1A) and FIG. 1C shows the case that light beams 10 and 10' are in phase. The resultant electric field 19" is much less for FIG. 1B than for FIG. 1C, and the contrast between the in phase and out of phase case is relatively large. There is thus little difference in the intensity of the light absorbed between light polarized as shown and light polarized parallel to the surface of the photoresist. The situation with light polarized parallel to the surface is shown in FIG. 1D where the vectors 18''', 18'''', 19''', and 19'''' are all parallel to the surface and to each other. The electric fields when the light beams 10''' and 10'''' are out of phase is shown in FIG. 1E, and in FIG. 1F when the light beams are in phase. In the case of light polarized parallel to the surface there is no resultant electric field if the light beams are out of phase, and the resultant electric field is great when the beams are in phase. In both polarization cases, changes in the relative phases of the electric fields 19 and 19' result in large changes in the magnitude of their sum and thus the intensity of the light, producing image contrast. FIG. 1B shows the electric field vectors 19 and 19' of FIG. 1A where the light beams 10 and 10' are out of phase. The resultant electric field 19" is perpendicular to the surface and small. In contrast, when the light beams 10 and 10 are in phase to produce a light spot on the resist, FIG. 1C shows that the electric fields 19 and 19' add to produce electric field 19" which is substantially larger, and nearly the same as would be the case if light beams 10 and 10' were polarized parallel to the surface of photoresist 12.

Figure 2A:
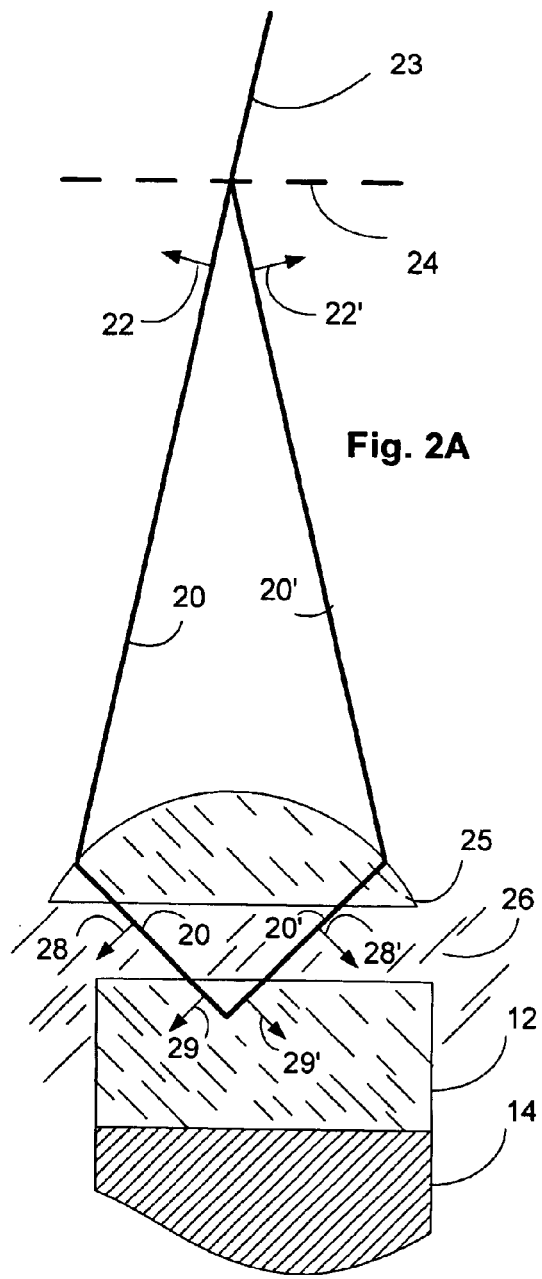
FIG. 2A shows light propagating trough a mask and an immersion photolithography system, the light having a polarization with a component perpendicular to the surface of the photoresist.
Figure 2B:
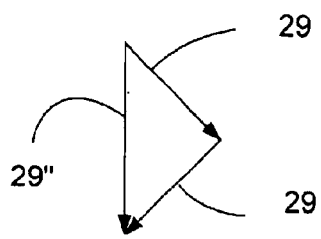
FIG. 2B shows the electric fields of a first set of phases of the light of FIG. 2A.
Figure 2C:
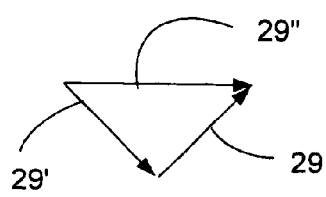
FIG. 2C shows the electric fields of a second set of phases of light of FIG. 2A.

However, in FIG. 2A the light beams are shown propagating through a medium 26 with index that more or less matches the index of refraction of the photoresist 12. Such immersion photolithography systems could be used to produce finer features in photoresist than available using the same wavelength of the light and types of optical systems as prior art systems. Light 23 illuminating a mask 24 produces as an example two light beams 20 and 20' having polarization with the electric field shown by vectors 22 and 22'. The light beams 20 and 20' resulting after passing through lens system 25 into medium bend little at the interface between the photoresist 12 and the medium 26, and the electric fields 29 and 29' of the light beams are at right angles in the medium in the case shown. In the case shown in FIG. 2A, light beams 20 and 20' are emitted from a part of the mask which is opaque, and they interfere at the surface of the mask to produce a minimum light intensity. When the light beams are brought together again in the photoresist, they are out of phase, and the resultant electric field 29" in the photoresist is shown in FIG. 2B, which shows that there is a significant resultant electric field perpendicular to the surface of the wafer. In addition, when the light beams 20 and 20' are emitted from a transparent part of the mask 24, one of the directions of the electric field vectors are reversed to give a maxima in intensity at the mask, but as shown in FIG. 2C the resultant field 29" in the photoresist is not as great as the resultant field would be if the beams were polarized parallel to the resist surface, and in fact the resultant field has exactly the same magnitude as if the light were coming from an opaque portion of the mask At 90 degrees the image contrast due to such variations in the relative phases 21 and 21' resulting from displacement along the substrate surface disappears, and the contrast even reverses (ie dark will print light and vice-versa) for larger angles of incidence.

FIG. 2A shows how a demagnifying immersion lens system can alter the electric field directions at the image, resulting in zero or reversed contrast when the polarization is not optimal. The illumination 23 (assumed off axis) diffracts from the mask 24 producing imaging rays 20 and 20' with a relatively small angle between them. The polarizations of these rays are in directions 22 and 22', also with a small angle between their axes. (In the example, the field vectors are shown anti-parallel for clarity. Note that they arise from a location of the mask where there must be a null light intensity) At a location where the mask is opaque, electric fields 22 and 22' sum to a small resultant. However, when these rays are refracted by a high numerical aperture immersion lens 25 in contact with a high refractive index fluid 26 above a resist layer 12 on a substrate 14, the angle between rays 20 and 20' is increased as a direct result of the demagnification of the lens. The electric fields 29 and 29' remain transverse to the directions of propagation of the rays 20 and 20' in the fluid 26 and resist 12. Those fields 29 and 29' have a large angle between them and sum to a resultant 29" that is larger than the resultant field formed by the fields 22 and 22'. When the fields 29 and 29' are orthogonal, as shown in FIG. 2A, the resultant field 29" would have constant magnitude, independent of the position in the image, eliminating the image contrast that would have been produced by mask 24 without this effect. FIGS. 2B shows of FIG. 2A, and FIG. 2C shows the fields 29 and 29' and the resultant field 29" in the configuration where the light beams 20 and 20' are in phase and coming from a transparent part of the mask. Note that the magnitude of the electric fields 29" and hence the absorbed power are equal in this case and there is no contrast.

The problems introduced by the immersion lithography set up can be addressed in several ways.

The novel problem of the relative phases of the light in an immersion photolithography system is particularly noxious when using phase shift mask technology. However, the problem has been solved by the inventor by using light polarized parallel to the surface of the photoresist (i.e. out of the page in the FIGS. 1A, 1D and 2A as shown).

Figure 3:
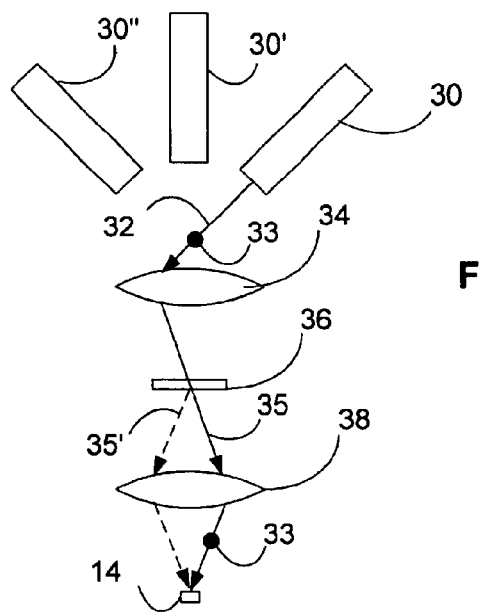
FIG. 3 shows an embodiment of the invention.

FIG. 3 shows a schematic side view of a set up for a tangential polarization system. Representative light sources 30, 30', and 30" are shown, with light 32 from light source 30 having electric field polarization 33 (pointing out of the plane of the page) shown schematically impinging on to an outer part of a condensing lens system 34. The exit pupil of light source 30 is imaged through the mask 36 and through the outer portion of the exposing imaging immersion lens 38. Patterned light 35 and 35' diverging from the mask 36 is imaged by the exposure lens 38 on to the substrate 14. If a polarizer is placed in the path of light 32, or if light source 30 produces polarized light as shown by the horizontal polarization vector 33, such that the light impinging on to imaging lens 38 is tangentially polarized as shown by vector 33, light falling on to substrate 14 will be polarized parallel to the surface of substrate 14.

Figure 4:
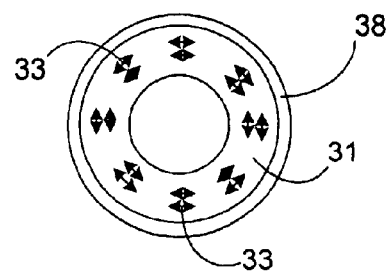
FIG. 4 shows a polarization effected for an embodiment of the invention.
Figure 5:
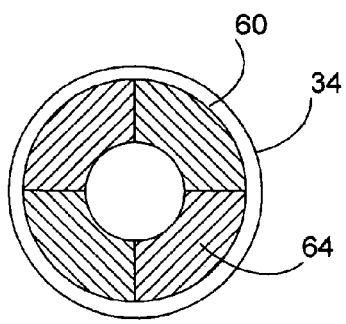
FIG. 5 shows a polarizer for an embodiment of the invention.
Figure 6:
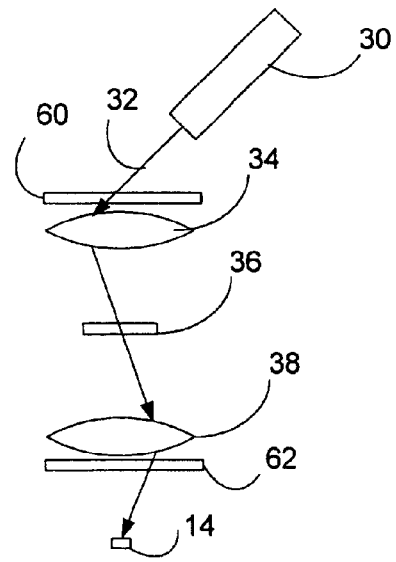
FIG. 6 shows placement positions for a polarizer for embodiments of the invention.

FIG. 4 shows a plan view of an example of the desired polarization 33 of the light impinging on to lens 38 in the absence of mask 36. In this case, the outer region of lens 38 consists of an annulus 31 illuminated with the polarization 33 which is tangential to the outer edge of lens 38. A preferred embodiment of the invention which produces approximately the desired polarization uses a 4 quadrant polarizer 60 with polarization direction sketched by the hatching 64 which approximates a tangential polarizer. Such a polarizer is sketched in FIG. 5 in plan view when place near the condensing lens 34 as shown in FIG. 6. Other preferred embodiments use from two to sixteen polarizers. Light falls transmitted through the center of the lens may or may not be blocked, but is not important for the contrast as explained before.

A tangentially (or otherwise) transmitting polarizing element may also be placed elsewhere in the projection lens system. Other preferred embodiments of the invention places a polarizer just after the output element of the lens system 38, which is just above the wafer, or immersed in the index matching fluid, or near the condenser lens 34. Preferred positions of tangential polarizers 60 or 62 are shown schematically in FIG. 6.

In another solution to the problem of contrast is immersion lithographic systems, photoresists can be devised that preferentially are sensitized by light polarized in the plane of the photoresist film and are relatively unaffected by the component of light polarized perpendicular to the plane of the photoresist film. Such materials are known, but are not well known in the UV photoresist communities. There is every reason to believe that a photoresist with the required properties could be devised, given reasonable experimental effort and the teaching of this specification. When such a material is used as a photoresist, the image projection system can employ essentially unpolarized light or light polarized sub-optimally in terms of the discussion above. Such a polarization sensitive resist would show contrast even when the interfering electric fields were oriented orthogonally as in FIG. 2.

It is well known in the art that many molecules have one or more axis, and that light polarized in particular direction with respect to these axis is either absorbed or not absorbed.

For example, there are many molecules that have an axis of elongation, where one dimension of the molecule is much larger than the other two dimensions. Such molecules are often sensitive to light having polarization parallel to the axis of elongation. A classical picture may be drawn of such molecules, where the electron acts like an electron in an elongated box. It takes a longer time for the electron to run from end to end along the long axis of the box than to run back and forth along a short axis of the box. If the time taken to run back and forth equates to a frequency of the incoming light, the molecule will absorb the light polarized along the axis. The electron will resonate at too high a frequency if it oscillates back and forth along a short axis, and hence the molecule may not substantially absorb light. At shorter wavelengths, other polarization selection rules may apply.

One example of such molecules which is very well known is the example of Polaroid$^R$ film. Polaroid$^R$ film contains linear molecules which absorb light polarized with electric fields in the long direction of the molecule. The energy of the absorbed photon is degraded into heat in Polaroid$^R$ film, but in theory could be transferred to another photoresist molecule, which would expose the photoresist molecule and allow development. The molecules in Polaroid film are aligned so that only one polarization is absorbed, and the alignment is effected by stretching the film. Various methods of aligning photoresist and other films will be discussed below.

In the case that a localized bond absorbs light of a short wavelength to produce a photochemical change necessary for a photoresist, the bond angle with respect to the molecular axis will determine the polarization absorbed and effective for exposure of the photoresist.

Figure 7:
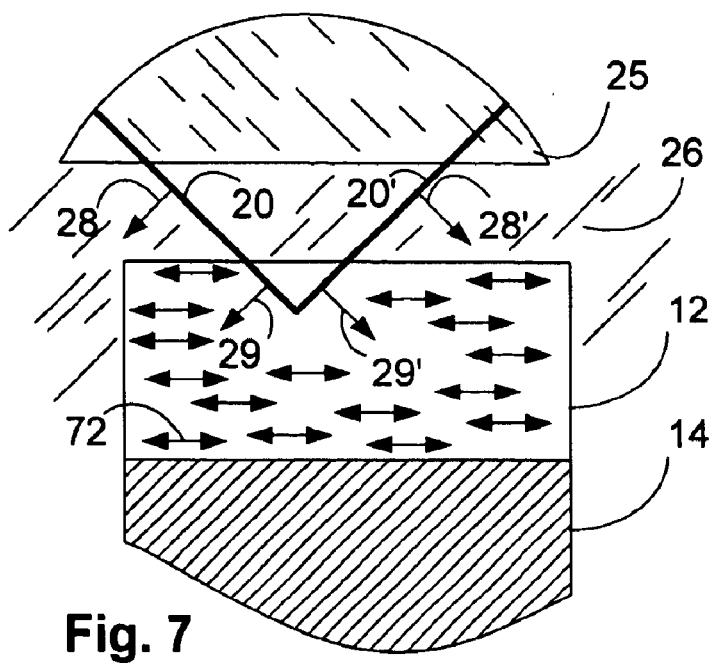
FIG. 7 shows a sketch of an embodiment of the invention.

FIG. 7 shows an embodiment of the invention where photoresist 12 comprises oriented molecules 72 oriented with their absorption axis parallel to the surface of the photoresist.

Other molecules can be thought of as planar molecules, where one dimension is much smaller than the other two. The sheets of carbon ions in graphite are one such example. In such molecules, light polarized perpendicular to the plane of the molecules is substantially less absorbed than light polarized in the plane of the molecules.

It is well known that materials such as liquid crystal materials placed on a substrate align in particular directions with respect to the surface of the substrate. It is also known that very thin layers of matrices of elongated molecules are known to have the elongated molecules align parallel to the surface of the substrate. Planar molecules are also known to align with their planes aligned parallel to the surface of the substrate. Photosensitive molecules which act as sensitizers or photoacid generators or photobase generators in photoresists may also be engineered to align in such a fashion, which would lead to the resist being sensitive to light polarized parallel to the surface of the substrate and being insensitive to light polarized perpendicular to the surface of the substrate.

A preferred embodiment of the invention is to provide a material fluid comprising a matrix and photosensitive molecules admixed in the matrix, each of the photosensitive molecules having an axis, wherein each photosensitive molecule is insensitive to light of wavelength $\lambda$ having a particular polarization with respect to the axis, and wherein each photosensitive molecules aligns with its axis having a particular direction with respect to the surface of the substrate when the matrix is formed as a layer on the surface of the substrate, and wherein the photosensitive molecules are insensitive to a light component of wavelength $\lambda$ with polarization perpendicular to the surface, and wherein light of wavelength $\lambda$ having polarization parallel to the surface causes a reaction in the photosensitive molecules which allows development of the layer as a photoresist layer. In the method of the invention, the fluid is applied as a layer on to the surface of a semiconductor substrate, and the molecules either align spontaneously with respect to the substrate, or are aligned by methods as known in the art. The layer is solidified by evaporation or by polymerization, as examples, and the oriented layer then acts as herein described.

In another preferred embodiment, a photosensitive molecule with an axis oriented perpendicularly to that above absorbs light and causes a reaction that inhibits the development of the layer as a photoresist material. The total photoresist formulation would then contain another photosensitive material (which may or may not have oriented axes within the matrix) that accelerates the chemical reactions needed for development. The balance between acceleration and inhibition gives rise to a net polarization sensitivity which selects the images formed by light polarized parallel to the plane of the resist film.

Figure 8:
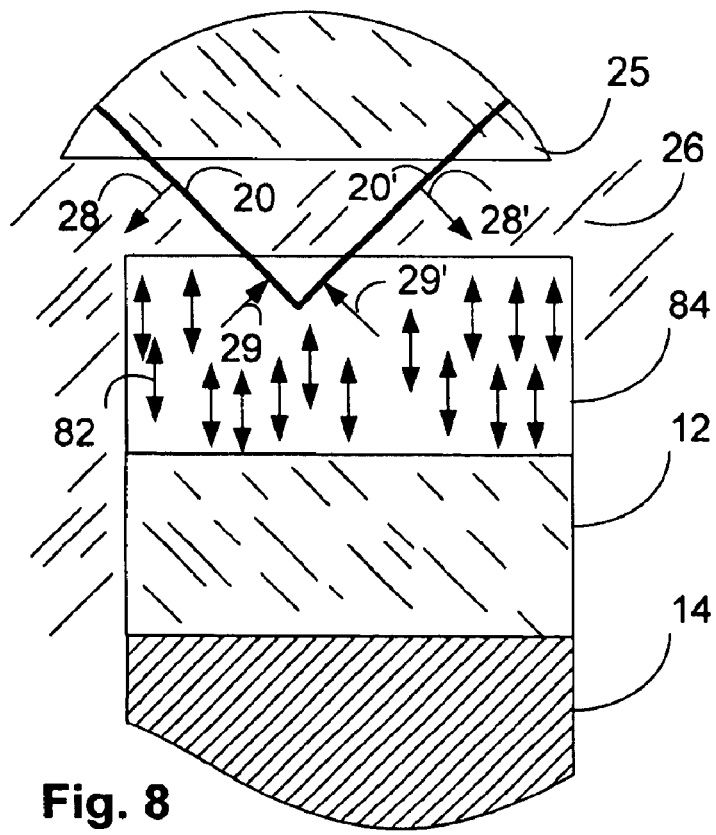
FIG. 8 shows a sketch of an embodiment of the invention.

In another preferred embodiment sketched in FIG. 8, the photoresist film stack contains a polarization-selective contrast enhancing layer 84 between the photosensitive material 12 and the immersing medium 26. The polarization selective layer is dichroic, allowing transmission of light polarized parallel to the surface of the photoresist 12 into the photosensitive medium 12 but attenuating or reflecting light with a polarization component normal to the surface of the photoresist layer 12. Molecules or other entities 82 are shown in FIG. 8 which would absorb electric field energies with components perpendicular to the surface of the photoresist 12.

In another preferred embodiment, such a layer 84 is also effective as a top anti-reflection coating for the desired polarization.

Figure 9:
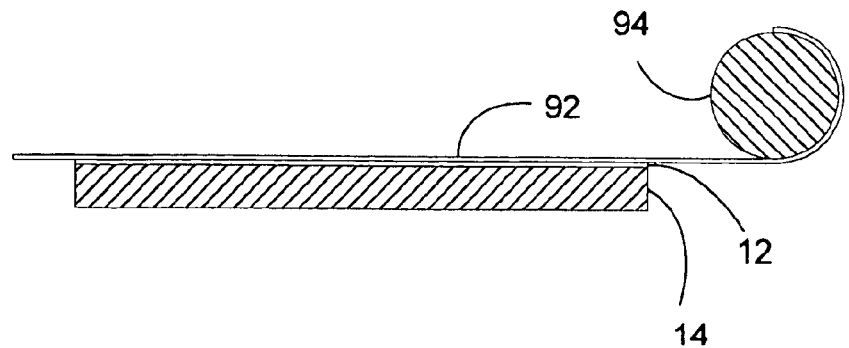
FIG. 9 shows a sketch of an embodiment of the invention.

In another preferred embodiment, layer 84 is formed as a sheet 92 in FIG. 9, and laminated to substrate 14 and photoresist 12 from a roller 94 or other lamination apparatus as is known in the art.

There are a number of techniques art of aligning molecules in thin films or layers known to the inventor. (In the sense of this specification, a thin layer or film is a layer or film with one spatial dimension very much smaller than two other spatial dimensions.) Among them are:

1. Applying a liquid crystal material as a thin layer on a surface of a substrate or as a thin layer between two surfaces. The liquid crystal material molecules-may be linear molecules which spontaneously align with their long axis parallel to the interface between the liquid crystal material and the substrate. If the surface of the substrate is prepared by methods known in the art, the liquid crystal molecules will in fact align in one direction so that they are all parallel to one another and parallel to the interface. This situations holds in the well known liquid crystal displays, wherein light propagating normal to the surface and polarized parallel to or perpendicular to the axis of the molecules interacts differently and has different propagation constants for each polarization (ie the index of refraction is different for the different polarizations). The molecules in such displays may be rotated by the effect of an electric field to align with their axis perpendicular to the surface, so that light propagating perpendicular to the surface has polarization perpendicular to the axis of all the molecules, and the difference in propagation constants disappears. Such molecules may be solidified by polymerization or by being incorporated in a monomer which is polymerized, and the orientation is therefore fixed. Molecules in such a film are of use in a film such as layer 84 in FIG. 8 or 92 in FIG. 9. The liquid crystal material used in liquid crystal displays is generally transparent to visible light polarized both perpendicular and parallel to the axis of the molecules. However, from general principles of optics, the difference in refractive index arises from a difference in the wavelength dependence of the absorption coefficient, and it is expected that such liquid crystal materials will have a spectral region where one polarization is absorbed, and the orthogonal polarization is not absorbed. Such linear molecules where the differing absorption of the light occurs at the wavelengths needed for the lithography are preferred for the present invention. Such wavelengths are preferably less than 260 nm, more preferably less than 200 nm and most preferably less than 160 nm.

2. Applying a Langmuir-Blodgett film to the surface of a substrate. It is well known that long chain molecules having a hydrophilic and a hydrophobic end my be closely stacked in a single layer with their long axis perpendicular to a surface, and that multiple layers may be built up by repeating the application process. Such molecules may also be in principle designed to absorb light having a component of the electric field vector perpendicular to the surface. Normally, such monolayer or multilayer films are adhered to the surface of a substrate, but techniques known in the art may produce solidified films which are separated from the surface and are free standing.

Note that the examples drawn from the art of liquid crystal devices and LangmuirBlodget films are for illustrative use only, and that the present invention differs radically from their prior art uses in that light is not propagating in the layer substantially normal to the surface of the layer. Rather, in the immersion photolithographic art of the invention, the light is propagating in the layer in a direction substantially different from the normal to the surface of the layer. The light used for exposing the photoresist film is preferably propagating in the photoresist with an angle greater than 35 degrees to the normal, more preferably greater than 40 degrees, and most preferably greater than 45 degrees.

Light propagating substantially parallel to the surface of the layer, such as in the art of film optical waveguides, is also radically different than the art of the invention. Light does not propagate parallel to the surface in a film until it is many wavelengths thick (eg a single mode fiber has a core diameter about 6 microns for light of communication frequencies). In contrast, photoresist thicknesses are typically around a wavelength of light. (EG. a single mode fiber has a core diameter about 6 microns for light of communication frequencies).

At the thinnest film thickness where the light can propagate the angle between propagation direction and normal to the surface of the film is 90 degrees. For thicker films, sketches of the light propagation show light bouncing from side to side of the film, where the light is totally reflected by total internal reflection. If the angle between the light propagation direction and the surface normal is too little, the light escapes the film. For the very large index of refraction difference between glass (n=1.5) and air (n=1.0), the critical angle is about 45 degrees. However, the angle is usually much less since the index differences between core and cladding of the optical waveguide are usually much less than 0.5.

While the thickness of the contrast enhancing film 84 of the invention is limited only by the distance between surface of the photoresist 12 and the lens element 25 in FIG. 8, the most preferred embodiment of the invention is a film thickness just sufficient to attenuate light having a polarization normal to the surface so that adequate contrast is achieved.

Figure 10:
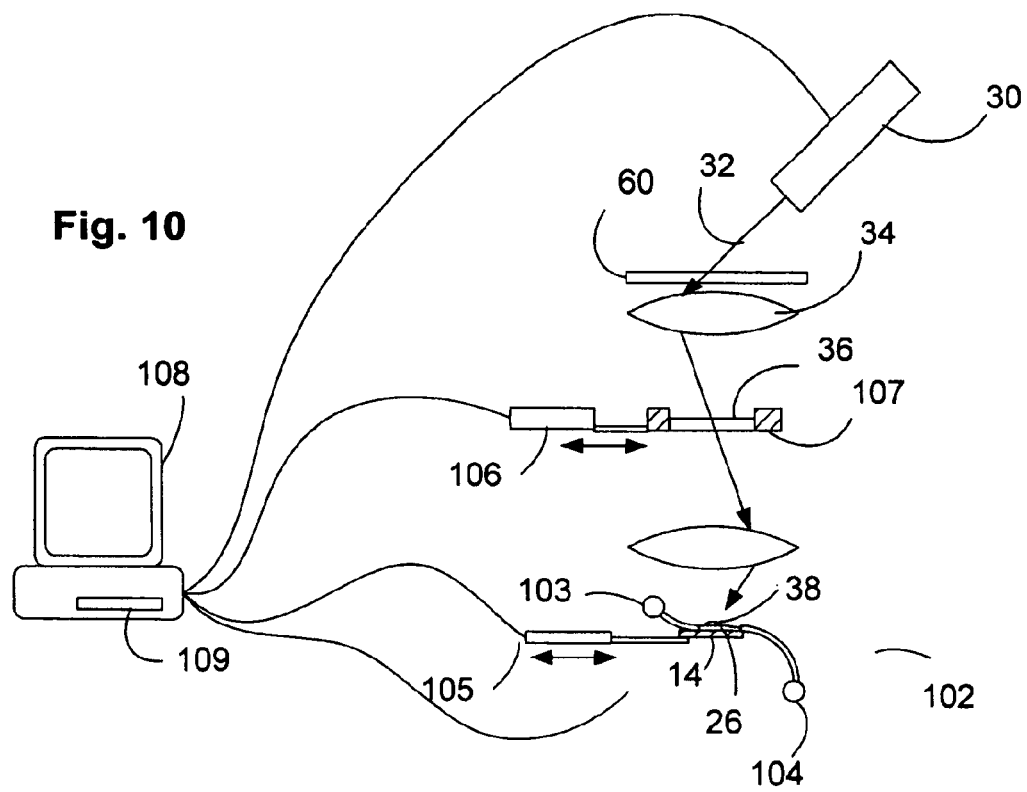
FIG. 10 shows a sketch of a system embodying of the invention.

A system for using the object of the invention is shown sketched in FIG. 10. A substrate 14 is shown immersed in an immersion fluid 26 Apparatus 103 and 104 is used to add and remove the immersion fluid from the system as needed to provide a layer of fluid between the final lens element of lens 38 and the wafer 14. The immersion fluid 26 contacts both an area of the wafer 14 which is to be exposed and the final lens element of lens 38 so that the light passing between lens 38 and wafer 14 to expose photoresist 12 passes only through only high index of refraction material. A wafer insertion and withdrawal tool 105 is shown, as is a mask insertion and withdrawal tool 106 for insertion and withdrawal of mask holder 107. A computer system 108 is shown connected to the system controls the apparatus for handling the immersion fluid, the wafer handling tool 105, the mask handling tool 106, and the illumination system 30. A computer program contained in a computer readable medium 109 controls the computer 108. The computer readable medium may be included in the computer 108 as sketched, or may be stored separate from the computer in any location as known to one skilled in the computer art.

Obviously, many modifications and variations of the present invention are possible in light of the above teachings. It is therefore to be understood that, within the scope of the appended claims,the invention may be practiced otherwise than as specifically described.

I claim:

1. A composition of matter, comprising:

a fluid for forming a photoresist layer on a surface of a substrate, the fluid comprising;

photosensitive molecules, each of the photosensitive molecules having an axis, wherein each photosensitive molecules aligns with its axis having a particular direction with respect to the normal to the surface of the substrate when the fluid is formed as a layer on the surface of the substrate, and wherein each photosensitive molecule has a different sensitivity to light of wavelength λ having a first linear polarization parallel to the axis than to light of a second linear polarization orthogonal to the first polarization such that a fluence of light of either one of the first or second polarizations causes a reaction in the photosensitive molecules which allows development of the layer as a photoresist layer, and that same fluence of light of the orthogonal polarization does not cause a reaction which allows development of the layer as a photoresist layer.

2. The composition of matter of claim 1, wherein the fluid has been applied as a layer attached to a semiconductor substrate, and wherein the fluid layer has been solidified and forms a solid photoresist layer, the solid photoresist layer having the photosensitive molecules with axis aligned with respect to the normal to the surface of the substrate.

3. The composition of matter of claim 2, wherein the solidified layer has been exposed to patterned light of wavelength λ.

4. The composition of matter of claim 3, wherein the exposed solidified layer has been has been developed to form a patterned photoresist on the surface of the semiconductor substrate.

5. A method, comprising:
a) applying a layer of a first fluid for forming a photoresist layer on a surface of a semiconductor substrate, the first fluid comprising;

photosensitive molecules, each of the photosensitive molecules having an axis, wherein each photosensitive molecules aligns with its axis having a particular direction with respect to the normal to the surface of the substrate when the fluid is formed as a layer on the surface of the substrate, and wherein each photosensitive molecule has a different sensitivity to light of wavelength $\lambda$ having a first linear polarization parallel to the axis than to light of a second linear polarization orthogonal to the first polarization such that a fluence of light of either one of the first or second polarizations causes a reaction in the photosensitive molecules which allows development of the layer as a photoresist layer, and that same fluence of light of the orthogonal polarization does not cause a reaction which allows development of the layer as a photoresist layer; and b) solidifying the first fluid layer.

6. The method of 5, further comprising;

c) inserting the photoresist covered semiconductor wafer into a photolithographic exposure tool;

d) immersing the semiconductor wafer in a second fluid transparent to light of wavelength $\lambda$, the second fluid having an index of refraction for light of wavelength $\lambda$ greater than 1.3; and e) exposing the photoresist layer with patterned light of wavelength $\lambda$.

7. The method of 2, further comprising;

f) developing the photoresist layer.

\* \* \* \* \*